United States Patent
Rhee et al.

(10) Patent No.: US 6,667,525 B2
(45) Date of Patent: Dec. 23, 2003

(54) SEMICONDUCTOR DEVICE HAVING HETERO GRAIN STACK GATE

(75) Inventors: Hwa Sung Rhee, Seoul (KR); Nae In Lee, Seoul (KR); Jung Il Lee, Yong-In (KR); Sang Su Kim, Yong-In (KR); Bae Geum Jong, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/086,565

(22) Filed: Mar. 4, 2002

(65) Prior Publication Data
US 2003/0164528 A1 Sep. 4, 2003

(51) Int. Cl.[7] .................................. H01L 29/76
(52) U.S. Cl. .................... 257/407; 257/412; 257/369; 257/385; 257/616
(58) Field of Search ................... 257/407, 412, 257/369, 385, 616

(56) References Cited

U.S. PATENT DOCUMENTS

| 5,670,397 | A | | 9/1997 | Chang et al. |
|---|---|---|---|---|
| 6,096,614 | A | | 8/2000 | Wu |
| 6,180,499 | B1 | | 1/2001 | Yu |
| 6,373,112 | B1 | * | 4/2002 | Murthy ........................ 257/407 |
| 6,468,888 | B1 | * | 10/2002 | Yu ............................... 438/592 |

* cited by examiner

Primary Examiner—Tom Thomas
Assistant Examiner—Thomas Magee
(74) Attorney, Agent, or Firm—Volentine Francos, PLLC (57) ABSTRACT

A semiconductor device includes a hetero grain stack gate (HGSG). The device includes a semiconductor substrate having a surface, a gate insulating layer formed over the surface of the semiconductor substrate, and a gate electrode formed over the gate insulating layer, wherein the gate electrode includes a lower poly-SiGe layer having a columnar crystalline structure, and an upper poly-Si layer having a random crystalline structure. In one embodiment, the gate electrode includes a lower poly-SiGe layer having a columnar crystalline structure, an intermediate layer having an random crystalline structure, and an upper poly-Si layer having a columnar crystalline structure. A method of manufacturing a semiconductor device having an HGSG comprises depositing a gate insulating layer over a surface of a semiconductor substrate, depositing a lower poly-SiGe layer having a columnar crystalline structure over the gate insulating layer, depositing an amorphous Si layer over the lower poly-SiGe layer, and crystallizing the amorphous Si layer to obtain an upper poly-Si layer having a random crystalline structure.

12 Claims, 9 Drawing Sheets

SEMICONDUCTOR DEVICE HAVING HETERO GRAIN STACK GATE

BACKGROUND OF THE INVENTION

1. Field of the Invention

The present invention generally relates to a semiconductor device structure and to a method of manufacturing the same, and more particularly, the present invention relates to a transistor having a hetero grain stack gate structure, and to a method of manufacturing the same.

2. Description of Related Art

Semiconductor devices such as field effect transistors (FETs) are becoming increasingly important in low voltage applications. As semiconductor devices are fabricated to have a higher degree of integration, a faster operating speed, and a lower power consumption, the magnitude or size of a complementary metal-on-semiconductor field effect transistor (CMOSFET) included in the device is rapidly reduced. As FET devices are scaled to smaller and smaller dimensions, manufacturers must refine transistor designs to maintain optimum device performance.

To control problems associated with a short-channel-effect (SCE) in a deep-submicron MOS transistor, a dual gate type CMOSFET design is widely used. The dual gate type CMOSFET has a surface channel in each of the NMOS and PMOS transistors, and a symmetric low threshold voltage ($V_{th}$). For example, with a currently-available conventional dual gate device, when the threshold voltage of the NMOS device is 0.5V, then the threshold voltage of the PMOS device is –0.5V. The dual gate type CMOSFET uses N+ and P+ polycrystalline (polysilicon) gate electrodes in the NMOS and PMOS transistors, respectively.

A conventional CMOSFET structure, and relevant steps of a method of manufacturing such a device, will be described with reference to FIGS. 1A–C as follows.

Figure 1A:
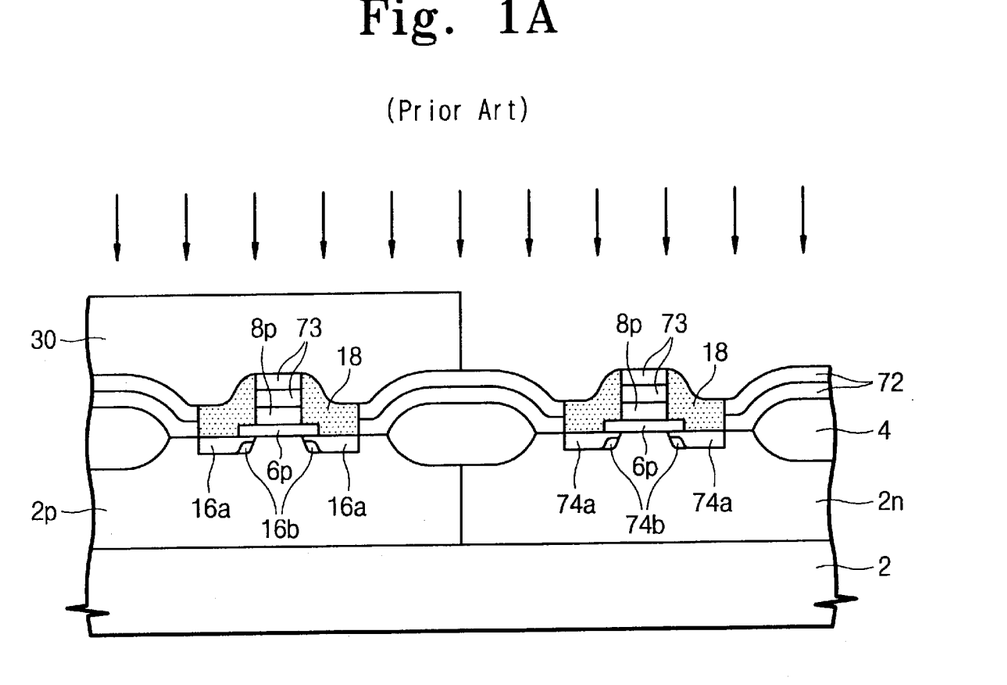
FIGS. 1A–1C shows a conventional transistor structure.

Referring to FIGS. 1A and B, a standard twin retrograded-well process is used to form an N-well 2n and a P-well 2p in the substrate 2 via a conventional photoresist masking and ion implantation process. In the N-well 2n and P-well 2p are formed lightly doped drain regions 16a and 74a, including halo doping profiles 16b and 74b respectively. On each of the N-well 2n and P-well 2p is formed a gate oxide layer 6p and a stacked gate electrode on top of the gate oxide layer 6p, including a thin polysilicon layer 8p and stacked polysilicon structure 73. Laterally adjacent to the gate electrode is a liquid phase deposition (LPD) oxide layer 18 and stacked polysilicon layers 72. Such a structure is then subjected to a heavy ion implantation using, for example, $BF_2^+$.

Figure 1B:
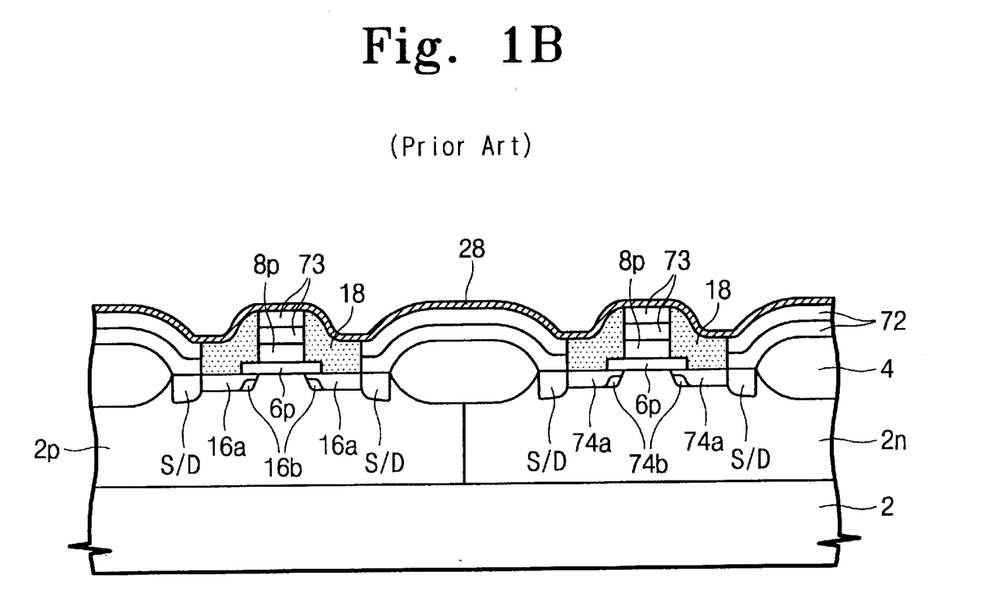

As shown in FIG. 1B, after doping for both the PMOS and NMOS transistors is complete, a thermal treatment is performed to condense then LPD oxide 18 and to activate the S/D implants. The thermal treatment diffuses the heavy implants in the polysilicon stack layers 72 into the substrate 2 to form the buried contacts and ultrashallow junctions. Then a refractory metal layer 28, such as Ti, Co, W etc., is sputtered on the polysilicon stack layers 72 and the LPD oxide 18.

Figure 1C:
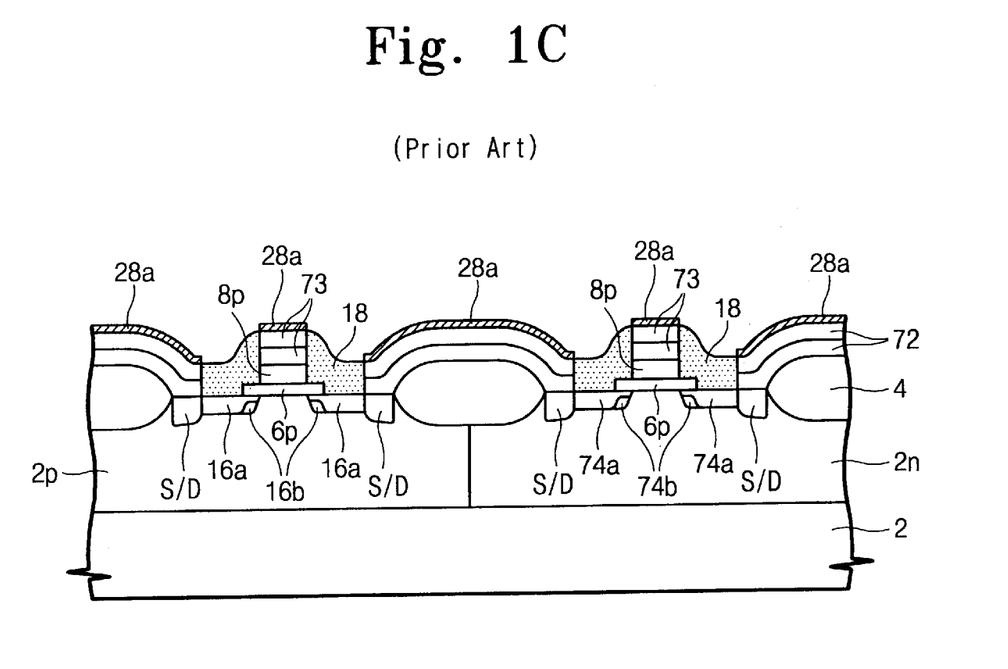

Turning to FIG. 1C, next a standard two-step silicidation process is performed, consisting of a rapid thermal annealing (RTA) to react the metal layer 28 with the polysilicon stack layer 72 to form a thin silicide layer 28a on the polysilicon stack layers 72. Then the unreacted metal is removed from the oxide using a standard wet etching process. A second RTA process is performed to transform the silicide's phase to a less resistive phase.

However, there are some problems with this conventional CMOSFET device.

In the PMOS transistor, when the thickness of the gate oxide layer 6p is less than 50 Å, boron implanted into the polysilicon gate electrode diffuses into the gate oxide layer 6p (Boron penetration). When this happens, the boron diffuses into the semiconductor substrate 2 and decreases the carrier mobility which causes a threshold voltage fluctuation. Due to the threshold voltage fluctuation, the threshold voltage $V_{th}$ of the gate cannot be controlled, thereby degrading the characteristics of the PMOS transistor.

Also, even though the polysilicon gate electrode is over-implanted by ions, it is not a complete conductor. Therefore, during the operation of the MOS transistor, a depletion region may arise due to a depletion of the electric charges at an interface between the gate oxide layer and substrate. The depletion region of the polysilicon gate has a magnitude of several angstroms (Å) and acts as a connected gate oxide layer capacitor. If the thickness of gate oxide layer is small, the characteristics of the transistor are poor due to the polysilicon-gate-depletion region.

To address the boron penetration and the polysilicon-gate-depletion effect (PDE) problems, a method of replacing a conventional polycrystalline silicon (poly-Si) gate with a polycrystalline silicon germanium (poly-SiGe) gate has been proposed (see, e.g., IEDM Tech. Dig. 1990 pp. 253–256). The poly-SiGe gate structure can be manufactured by the conventional CMOS process and can control the boron penetration and the PDE problems discussed above.

Also, the work function of poly-SiGe is different from that of poly-Si, thereby increasing the threshold voltage of the device. Therefore, the amount of channel doping can be decreased, increasing the carrier mobility.

However, when the metal silicide layer of Ti or Co is formed on the gate structure (as described above with respect to FIGS. 1A–C), it is difficult to form it on the poly-SiGe layer compared with forming it on the poly-Si layer. Also, due to the penetration of Ge into the silicide layer, the resistivity of the poly-Si layer is rapidly increased, which is undesirable.

Therefore, in the CMOS device with the conventional poly-SiGe gate, a single poly-SiGe layer is not used, but instead a stacked gate structure having a lower poly-SiGe layer and an upper poly-Si layer is used. The upper poly-Si layer of the stacked gate structure facilitates the silicide process carried out during the CMOS fabrication to thereby increase the conductivity.

Generally, the poly-SiGe layer is formed by a CVD method using a source gas of $SiH_4$ and $GeH_4$. To improve the PDE and the boron penetration characteristics of the poly-SiGe PMOS transistor, it is desirable to form the poly-SiGe layer to have a Ge concentration of at least 20% (see IEEE Electron Device Letters, 10(7), 1998, p.247, by W. C. Lee et. al.). However, when the Ge concentration is more than 30% and is deposited by a chemical vapor deposition (CVD) method, the surface roughness abruptly deteriorates. If the concentration of $GeH_4$ gas is increased to thereby increase the Ge concentration in the poly-SiGe layer, the roughness of the surface deteriorates proportionally to the increase in the $GeH_4$ concentration. Therefore, it is difficult to carry out a subsequent photolithography process, and pits are generated in the substrate during a subsequent etching processes. Accordingly, it is known in the art that the Ge concentration of the poly-SiGe layer for use in the gate is preferably in the range of 20–30%.

After the sequentially stacked poly-SiGe and poly-Si layers are formed as a gate electrode, thermal processes such as gate re-oxidation, silicon nitride deposition, and activation annealing (described above with respect to FIGS. 1A–C) are carried out.

However, at this time Ge diffuses from the lower poly-SiGe layer into the upper poly-Si layer. Accordingly, the Ge concentration of the poly-SiGe layer is reduced from the original Ge concentration (see IEEE Electron Device, 47(4), 2000 p.848 by Y. V. Ponomarev). To account for the Ge diffusion, the Ge concentration in the poly-SiGe layer when it is formed may be set to more than 30%. However, as stated above, this undesirably increases the surface roughness. On the other hand, if the poly-SiGe layer is formed with a Ge concentration of 20–30%, the Ge concentration in the resultant PMOS transistor is reduced to less than 20% after the final CMOS process, thus having little or no effect in controlling the PDE or the boron penetration.

Therefore, there is a shortcoming in the conventional semiconductor device wherein the gate electrode has the stacked poly-SiGe and poly-Si layers.

Accordingly, it would be desirable to provide an improved semiconductor device having a stacked poly-SiGe and the poly-Si layer with reduced Ge diffusion. It would further be desirable to provide a method of manufacturing a semiconductor device having a stacked poly-SiGe and the poly-Si layer with reduced Ge diffusion.

SUMMARY OF THE INVENTION

The present invention is directed to a semiconductor device including a gate having a discontinuous hetero grain stack structure, and to a method of forming such a device.

In one aspect of the invention, a semiconductor device includes a semiconductor substrate having a surface, a gate insulating layer formed over the surface of the semiconductor substrate, and a gate electrode formed over the gate insulating, wherein the gate electrode includes a lower poly-SiGe layer having a columnar crystalline structure, and an upper poly-Si layer having a random crystalline structure.

In another aspect of the invention, a semiconductor device includes a semiconductor substrate having a surface, a gate insulating layer formed over the surface of the semiconductor substrate, and a gate electrode formed over the gate insulating layer, wherein the gate electrode includes a lower poly-SiGe layer having a columnar crystalline structure, an intermediate layer having an random crystalline structure, and an upper poly-Si layer having a columnar crystalline structure.

In yet another aspect of the invention, a semiconductor device is manufactured by depositing a gate insulating layer over a surface of a semiconductor substrate, depositing a lower poly-SiGe layer having a columnar crystalline structure over the gate insulating layer, depositing an amorphous Si layer over the lower poly-SiGe layer, and crystallizing the amorphous Si layer to obtain an upper poly-Si layer having a random crystalline structure.

In still another aspect of the invention, a semiconductor device is manufactured by depositing a gate insulating layer over a surface of a semiconductor substrate, depositing a lower poly-SiGe layer having a columnar crystalline structure over the gate insulating layer, depositing at least one intermediate layer having an amorphous structure over the lower poly-SiGe layer, depositing an amorphous Si layer over the at least one intermediate layer, and crystallizing the amorphous Si layer to obtain an upper poly-Si layer having a random crystalline structure.

In a further aspect of the invention, a semiconductor device is manufactured by depositing a gate insulating layer over a surface of a semiconductor substrate, depositing a lower poly-SiGe layer having a columnar crystalline structure over the gate insulating layer, depositing an amorphous intermediate layer over the lower poly-SiGe layer, depositing an upper poly-Si layer over the amorphous intermediate layer, and crystallizing the amorphous intermediate layer to obtain a crystallized intermediate layer having a random crystalline structure between the lower poly-SiGe layer and the upper poly-Si layer.

BRIEF DESCRIPTION OF THE DRAWINGS

The features and advantages of the present invention will become more clearly understood from the detailed description that follows, with reference to the accompanying drawings. It is important to point out that the illustrations of the drawings may not necessarily be drawn to scale, and that there may be other embodiments of this invention that are not specifically illustrated but which will still fall under the scope of the present invention. In the drawings.

DETAILED DESCRIPTION OF PREFERRED EMBODIMENTS

Hereinafter, the present invention will be described in detail with reference to the accompanying drawings.

The diffusion mechanism in a poly-crystalline structure is different from that in a single crystalline structure because of a grain boundary in the poly-crystalline structure. Generally, since the grain boundary is a region in which atoms forming a solid structure are randomly arranged, the diffusion speed therein is faster than that in the grain boundary in which atoms forming a solid structure are arranged in an orderly fashion. Accordingly, in the poly-crystalline structure, the diffusion mostly occurs through the grain boundary.

Figure 2:
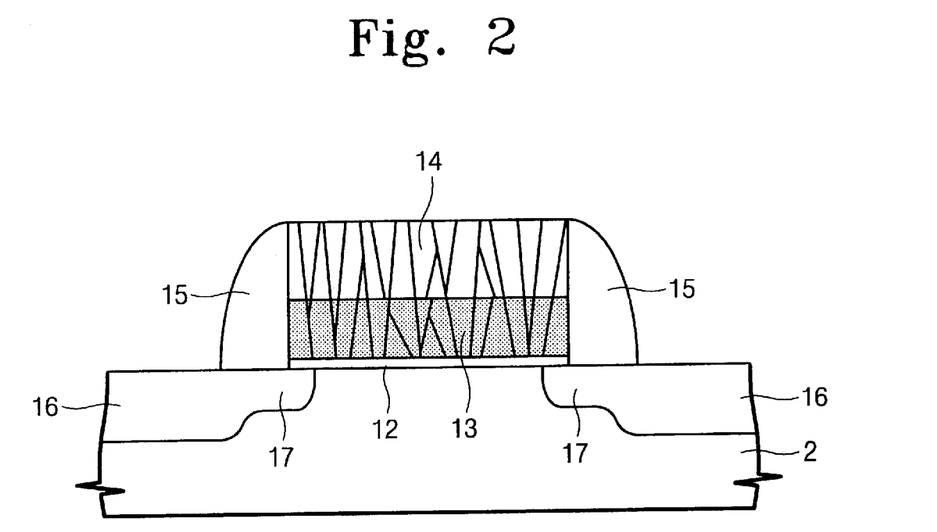
FIG. 2 shows another conventional transistor structure.

FIG. 2 illustrates a conventional gate structure for a conventional semiconductor (CMOSFET) device, wherein the crystalline structures of a lower poly-SiGe layer 13 and an upper poly-Si layer 14 form a continuous columnar structure, such as disclosed in U.S. Pat. No. 6,180,499 B1.

In this case, Ge easily diffuses through the grain boundary from the lower poly-SiGe layer 13 to the upper poly-Si layer 14. The continuous columnar structure of the grain boundary has a length along an X (horizontal) axis parallel to the semiconductor substrate that is shorter than the length along the Y (vertical) axis perpendicular to the substrate, and therefore acts as a kind of pipe, accelerating the diffusion of Ge into the upper poly-Si layer.

Figure 3:
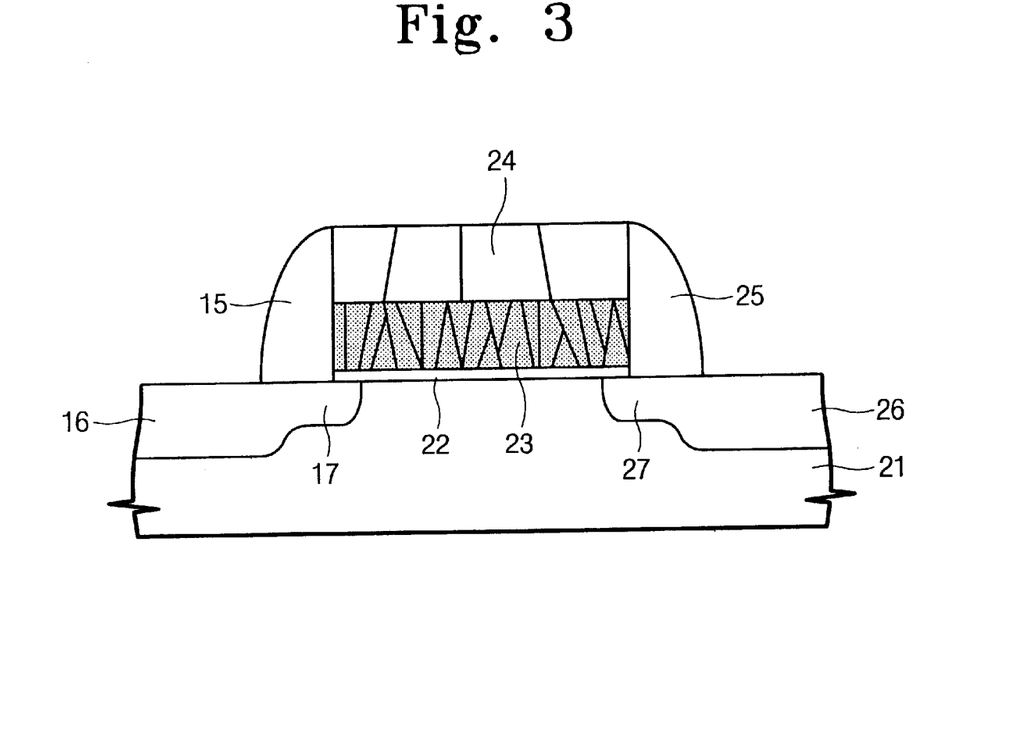
FIG. 3 shows a semiconductor device having a gate with a hetero grain stack structure.

FIG. 3 shows one embodiment of a semiconductor (CMOSFET) device having a hetero grain stack gate (HGSG). The gate shown in FIG. 3 comprises a lower poly-SiGe layer 23 having a columnar structure in which the grain size is smaller than the grain size in an upper poly-Si layer 24. The upper poly-Si layer 24 has a random crystalline structure in which the length of the grain size along the X (horizontal) axis is greater than or the same as the length along the Y (vertical) axis. Because the grain boundary of the lower poly-SiGe layer 23 is not formed continuously with the grain boundary of the upper poly-Si layer 24, the diffusion of Ge is restrained. Alternatively, the gate can be replaced with a structure having a lower layer of a random crystalline structure in which the grain boundary size is large, and an upper layer of a columnar structure in which the grain boundary size is small. However, to ensure evenly distributed implanted ions in the lower layer of the gate for forming NMOS and PMOS transistors, it is desirable that the lower poly-SiGe layer has the columnar structure.

Figure 4:
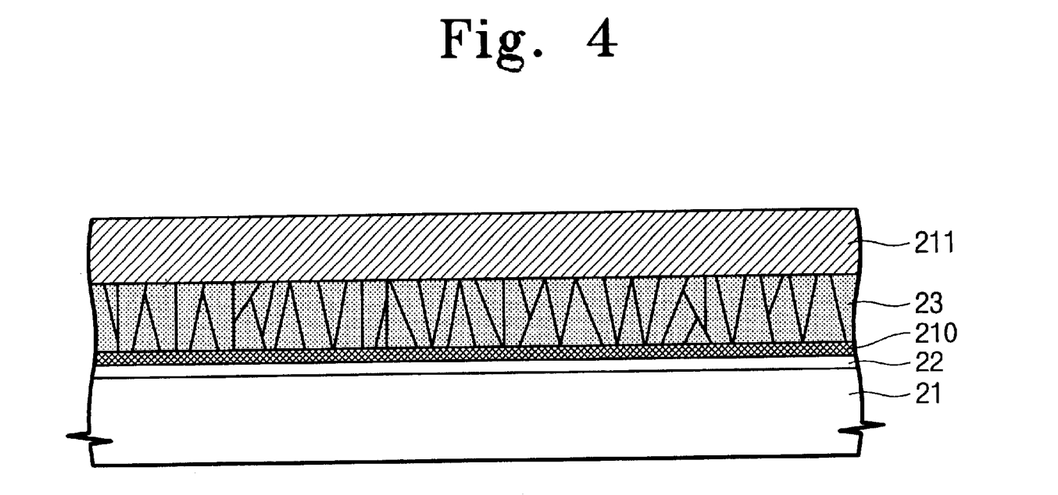
FIG. 4 illustrates a method of forming the gate having the structure shown in FIG. 3.

FIG. 4 illustrates a method of forming the gate having the structure shown in FIG. 3.

Referring to FIG. 4, a gate insulator 22 of silicon oxide ($SiO_2$) is formed on an Si substrate 21, and a poly-Si or amorphous Si layer 210 of 10–100 Å (preferably 10–50 Å) is formed by a chemical vapor deposition (CVD) method on the gate insulator 22. The Si layer 210 functions as a seed layer for the subsequent SiGe layer (see J. Electrochem. Soc. 141(8) 1994 pp.2235–2241). This is a generally known method of forming a poly-SiGe layer on a Si oxide layer. On the Si layer 210, a poly-SiGe layer 23 is formed using a source gas of SiH4 and GeH4 at a temperature of 450–600° C. by a CVD method. The poly-SiGe layer 23 has a columnar structure. On the poly-SiGe layer 23, an amorphous Si layer 211 is formed using a source gas such as $SiH_4$ or $Si_2H_6$ at a temperature of 350–580° C. Generally, it is known that the phase transformation temperature between the polycrystalline and amorphous structures is about 580° C. The amorphous Si layer 211 is crystallized to have a random polycrystalline structure by the thermal processes of re-oxidation and an activation annealing. Consequently, the formed gate structure is the same as that shown in FIG. 3.

Figure 5:
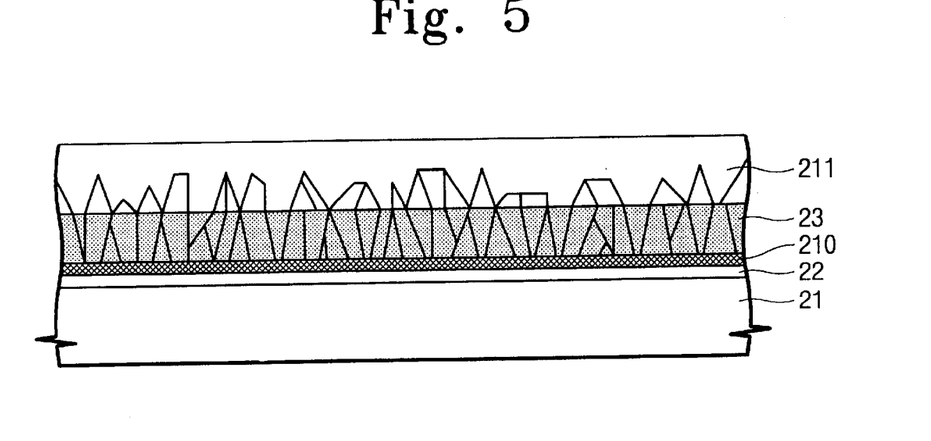
FIG. 5 illustrates a process of crystallization starting at an interface region in contact with the lower poly-SiGe layer during deposition of amorphous Si.

The lower the temperature at which the amorphous Si layer is formed, the better the results. For example, when the temperature is more than 500° C., crystallization starts at an interface region in contact with the lower poly-SiGe layer during the amorphous Si deposition process, wherein the amorphous Si layer has a continuous columnar structure as shown in FIG. 5. On the other hand, when the temperature is less than 550° C., the deposition speed of the amorphous Si layer is low, thereby reducing the throughput.

Figure 6A:
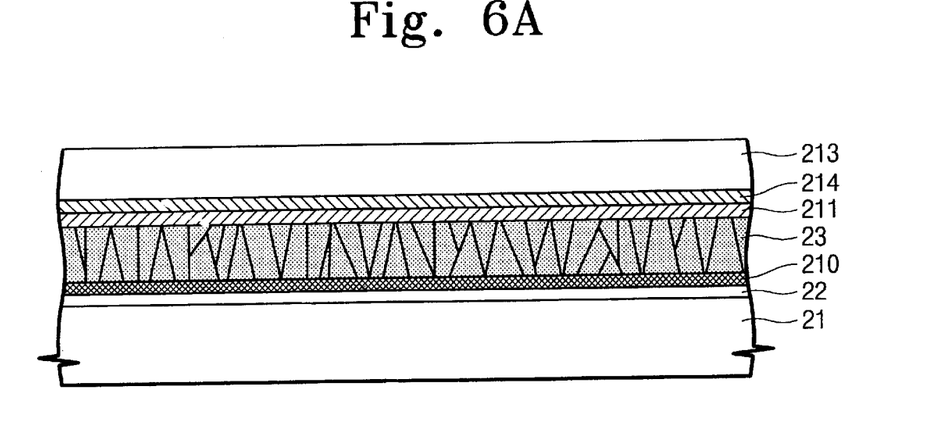
FIGS. 6A to 6B illustrate a second method of forming the gate having the structure shown in FIG. 3
Figure 6B:
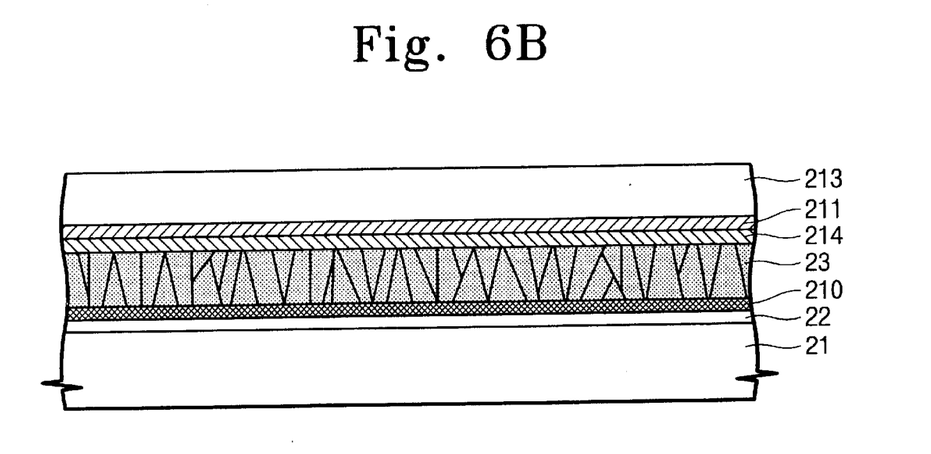

Accordingly, FIG. 6A and FIG. 6B illustrate another method of forming the gate having the structure shown in FIG. 3.

The steps of forming the gate insulator 22 of $SiO_2$, the seed Si layer 210, and the poly-SiGe layer 23 having a columnar structure are the same as that explained above, and consequently the explanation will not be repeated here. On the poly-SiGe layer 23, an amorphous Si layer 211, used as an interlayer, and an amorphous SiGe layer 214 are sequentially formed. In the embodiment shown in FIG. 6A, the amorphous SiGe layer 214 is formed after forming the amorphous Si layer 211. However, the amorphous SiGe layer 214 can be formed first, as shown in FIG. 6B. Also, only one of the amorphous Si layer 211 or the amorphous SiGe layer 214 may be formed. The amorphous Si layer 211 is beneficially formed to a thickness of 50–200 Å at a temperature of less than 500° C., and the amorphous SiGe layer 214 is formed to a thickness of 50–200 Å at a temperature of less than 450° C.

On the amorphous Si layer 211 (or the amorphous SiGe layer 214), an amorphous Si layer 213 is formed at a temperature of 500–580° C. In this case, since the amorphous Si layer 213 has a relatively high deposition speed, the throughput is not reduced.

Then, the gate structure shown in FIG. 3, in which the upper and lower grain boundaries are different from each other, is formed by patterning, gate re-oxidation, and formation of the gate spacers 15, 25. To complete the device, shallow source/drain regions 17, 27 are formed, deep source/drain regions 16, 26 are formed, and then annealing activates the source/drain regions.

One reason that the HGSG of FIG. 3 can be produced by the method illustrated in FIG. 6A or FIG. 6B is that when the deposition temperature is lowered, the energy required for crystallization is increased. Therefore, since the amorphous Si layer 211 is formed at a reduced temperature in the methods illustrated in FIG. 6A or FIG. 6B, it does not form the crystalline column structure. Also, because the crystallization of the amorphous Si 211 (or amorphous SiGe 214) begins at the interface between the poly-SiGe layer 23 and the amorphous Si layer 211 (or amorphous SiGe layer 214), and the crystallization pattern of the lower poly-SiGe layer 23 moves upward, the interlayer acts to restrain the crystallization pattern from moving upward.

Figure 7:
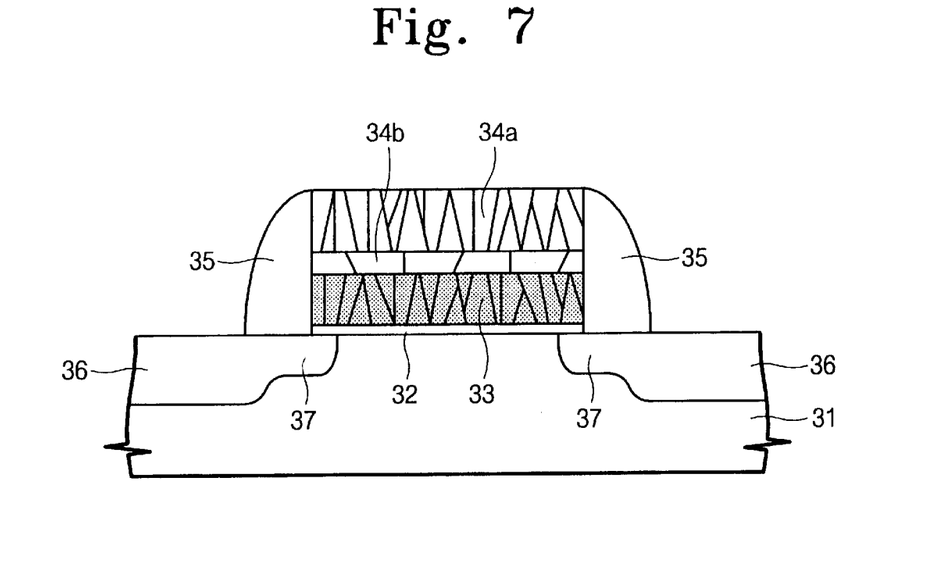
FIG. 7 shows a second embodiment of a semiconductor device with a gate having a hetero gain stack structure.

FIG. 7 shows a second embodiment of a semiconductor (CMOSFET) device having an HGSG. The gate of FIG. 7 comprises a lower poly-SiGe layer 33 and an intermediate layer 34a such as a poly-Si or poly-SiGe layer. The lower poly-SiGe layer 33 has a columnar structure in which a grain size is smaller than the grain size in an intermediate layer 34a such as a poly-Si or poly-SiGe layer. The intermediate layer 34a, such as a poly-Si or poly-SiGe layer, has a random structure in which the grain size is larger than the grain size in the lower poly-SiGe layer 33.

In a method of forming the gate structure of FIG. 7, a poly-SiGe layer 33 is formed by the same method as explained with reference to FIG. 4. An intermediate layer 34a (for example, a poly-Si layer) is obtained by forming, e.g., an amorphous Si layer to a thickness of 20–500 Å, and then by crystallizing it to have a random crystalline structure in a subsequent heat treatment. On the poly-Si layer 34a, a poly-Si layer 34b having a columnar structure is deposited at a temperature of more than 580° C. by a CVD method.

Figure 8A:
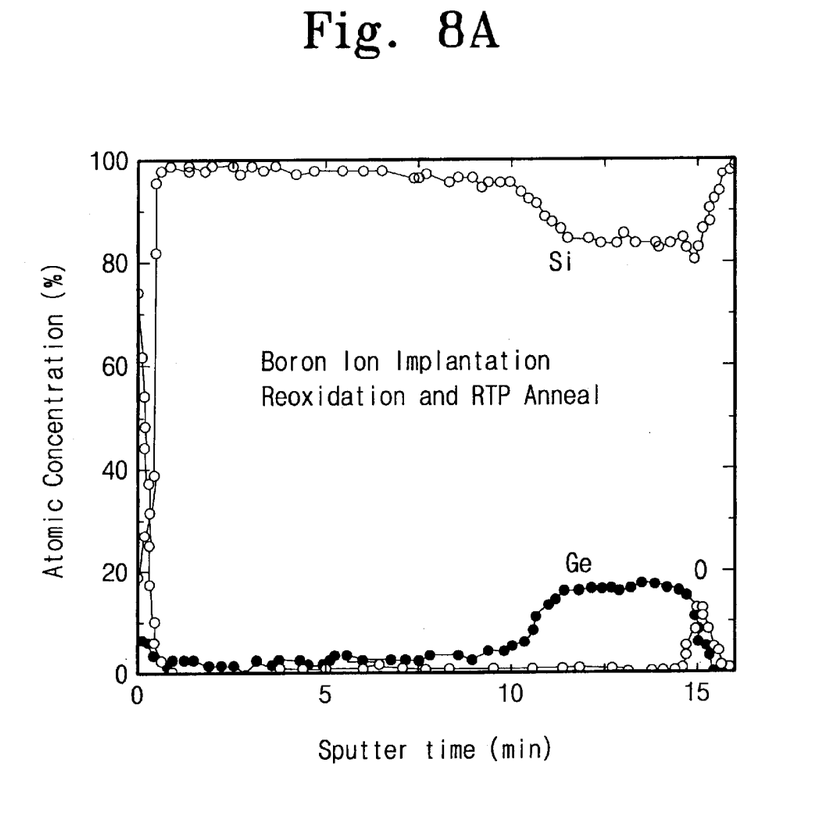
FIGS. 8A and 8B show Ge concentration distributions for gates having the structures shown in FIGS. 2 and 3.
Figure 8B:
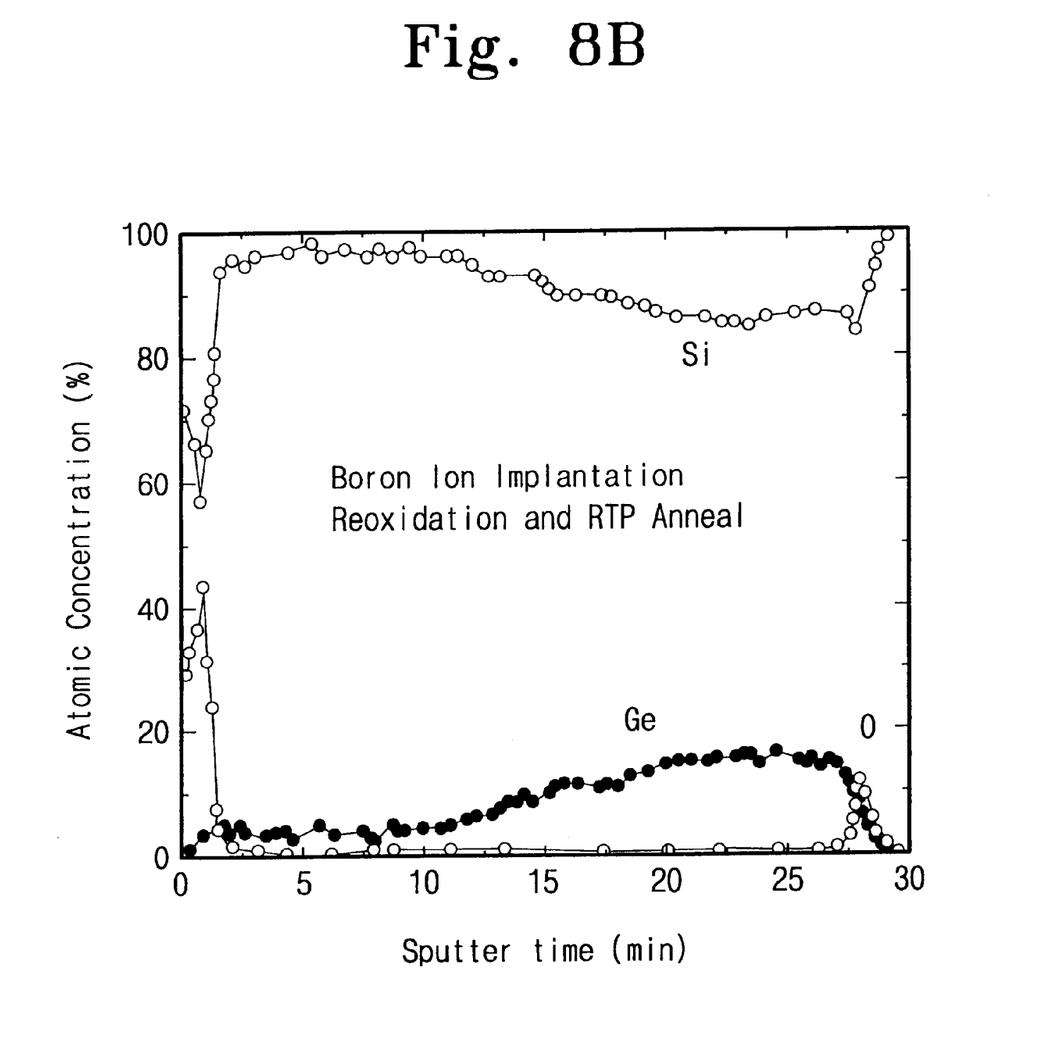

FIG. 8A and FIG. 8B show Ge concentration distributions after a boron ion implantation, a re-oxidation and an activation annealing were carried out to form PMOS transistors, after forming gates having the structures shown in FIG. 3 and FIG. 2, respectively.

More specifically, the gate having the Ge concentration shown in FIG. 8A has the hetero grain stack structure illustrated in FIG. 3. To form the gate structure, a lower poly-SiGe layer having a Ge concentration of 20% was formed to a thickness of 600–700 Å, and an upper poly-Si layer was then formed to a thickness of 1,300–1,400 Å. After patterning the gate, boron ions were implanted and re-oxidation was carried out at a temperature of 950° C. for 2 minutes. A rapid thermal process (RTP) was carried out at a nitrogen atmosphere of 1,000° C. for 20 seconds. The Ge concentration distribution was measured using an auger electron spectroscopy (AES) analysis.

Meanwhile, the gate having the GE concentration shown in FIG. 8B is the conventional gate of FIG. 2. In that case, a lower poly-SiGe layer having a Ge concentration of 30% was formed at a thickness of 600–700 Å and an upper poly-Si layer was then formed to a thickness of 1,300–400 Å. After carrying out the same processes as FIG. 8A, the Ge concentration distribution was measured using the AES analysis.

In FIGS. 8A–B, the X-axis indicates a sputtering time. Increased sputtering time (greater X axis values) equate to the lower portions of the gate layer. The Y-axis indicates the distribution of the percentage of atom (Ge or Si) concentration present (black dots).

The Ge concentration curve (black dots) shown in FIG. 8A shows an abrupt change in the Ge concentration profile when the Ge concentration was densified on the lower poly-SiGe layer of the gate. In contrast, in the chart of FIG. 8B the left-hand side of the curve (black dots) shows the Ge concentration profile having a tail in which the Ge concentration is slowly reduced from its level at the interface between the upper poly-Si layer and the lower poly-SiGe layer of the gate. Also, FIG. 8B shows that the Ge concentration of the original lower poly-SiGe layer was reduced from 30% to 20% after undergoing the boron ion implantation, reoxidation, and RTP annealing processes. In other words, FIG. 8B illustrates that Ge diffuses from the lower poly-SiGe layer into the upper poly-Si layer.

As is apparent from the results of the AES analysis shown in FIG. 8A and FIG. 8B, it can be appreciated that the gate structure shown in FIG. 3 restrains Ge from diffusing as compared with the conventional structure shown in FIG. 2.

Figure 9:
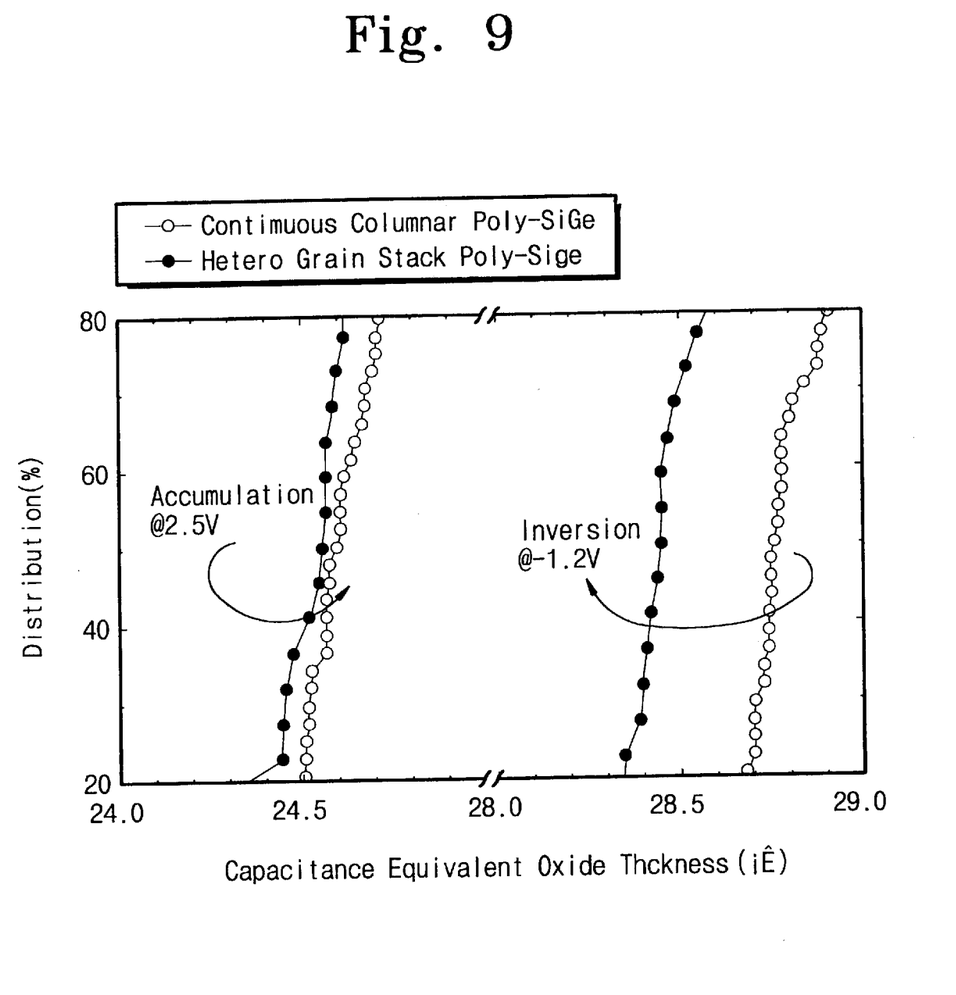
FIG. 9 illustrates the capacitance equivalent oxide thickness (CET) of gates having the structures FIGS. 2 and 3.

FIG. 9 is a chart illustrating the results that were obtained by measuring the capacitance equivalent oxide thickness (CET) of gates having the structures in FIG. 2 and FIG. 3. In the diagram, open (white) circles and closed (black) circles show the CETs of the gates of FIG. 2 and FIG. 3, respectively. The CET is the oxide thickness calculated by a capacitance vs. voltage plot (C-V plot). The C-V plot is obtained by measuring the difference in capacitance between the gate and the substrate according to a change in voltage supplied to the gate. Generally, the capacitance is in direct proportion to the dielectric constant of an insulation layer between the gate and the substrate, and in inverse proportion to the thickness thereof. For example, in the gate of a PMOS transistor, when the gate is supplied with a positive voltage, then the substrate becomes in an accumulation state in which electrons are accumulated. Conversely, when the gate is supplied with a negative voltage then the substrate becomes in an inversion state in which holes are accumulated. The curves shown on the left-hand side of FIG. 9 show, respectively, the CETs of the gates of FIG. 3 and FIG. 2 calculated from the C-V plot in the accumulation state. There was no significant difference between the CET of the gate having the discontinuous hetero grain stack structure shown in FIG. 3 and the CET of the gate having the continuous columnar stack structure shown in FIG. 2.

The curves shown on the right-hand side of FIG. 9 show, respectively, the CETs of the gates of FIG. 3 and FIG. 2 calculated from the C-V plot in the inversion state. The poly-gate is not depleted in the accumulation state, but it is depleted in the inversion state. Therefore, the CET in the inversion state has a value higher than that of the CET in the accumulation state in consideration of the poly-gate depletion. That is, since the poly-gate depletion region acts as a capacitor connected with the gate insulator during the operation of the semiconductor device, the CET in the inversion state has a value higher than that of the CET in the accumulation state. As shown in FIG. 9, the CETs of the gate of FIG. 3 (black circles) were smaller than those of the gate of FIG. 2 (open circles). This means that the gate depletion in the gate of FIG. 3 was smaller than that of the gate of FIG. 2. Thus, it can be appreciated through the diagram of FIG. 9 that in the HGSG (e.g., FIG. 3), the Ge diffusion was restrained and the Ge concentration was maintained to a high degree compared with the conventional gate structure.

Figure 10A:
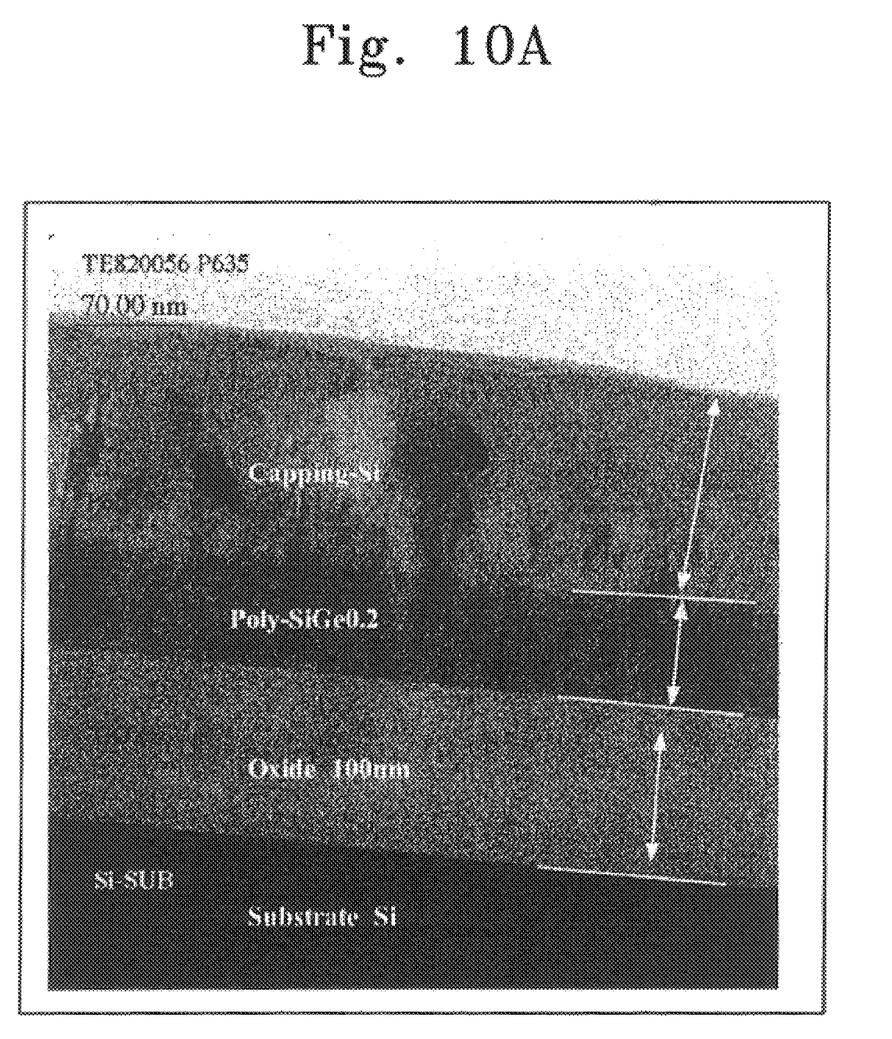
FIGS. 10A and 10B show vertical views of the gates of FIGS. 2 and 3, as viewed through TEM (Tunneling Electro-Microscopy).
Figure 10B:
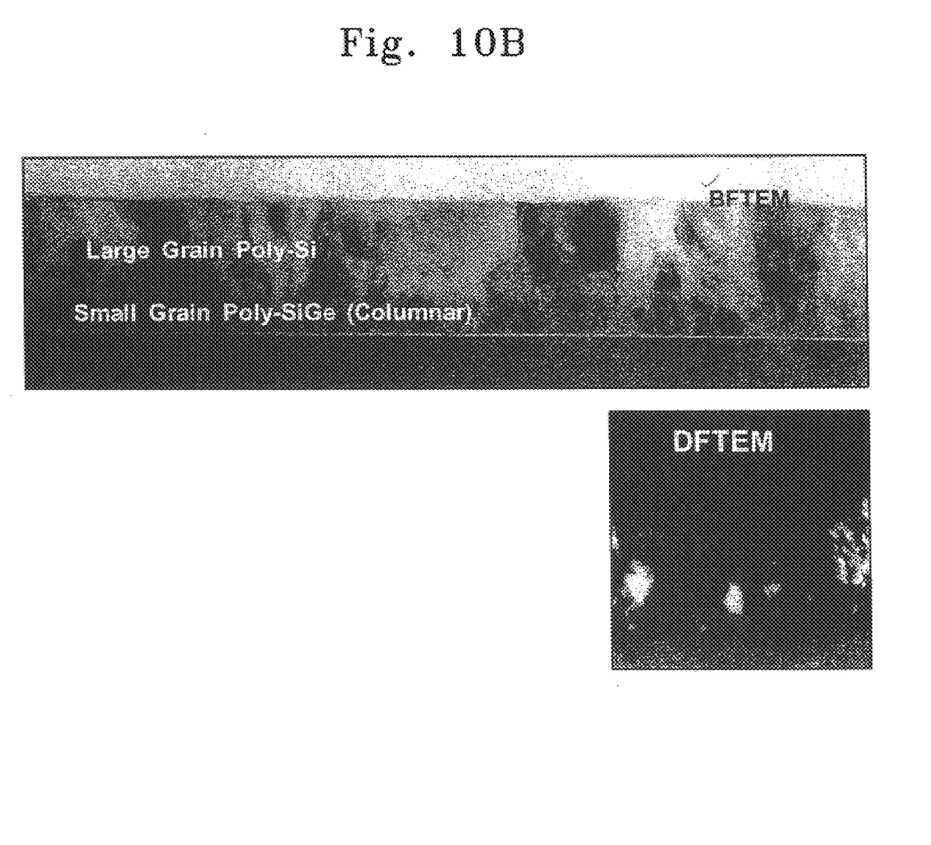

FIGS. 10A and 10B are vertical views of the conventional gate structure and an HGSG, respectively, as viewed through TEM (Transmission Electro-Microscopy). FIG. 10A shows the gate structure of FIG. 2, and FIG. 10B shows the gate structure of FIG. 3, formed by the method illustrated in FIG. 6A. The lower poly-SiGe layer is formed using source gases of 200 sccm $SiH_4$, 40 sccm GeH4, and 6 slm H2 at 500–550° C. The interlayer amorphous Si is formed using source gases of 200 sccm $SiH_4$ and 6 slm $H_2$ at 450–500° C. The interlayer amorphous SiGe is formed using source gases of 200 sccm SiH4, 35 sccm GeH4, 6 slm $H_2$ at 400–450° C. The upper amorphous Si is formed using source gas of 250 sccm $SiH_4$, 6 slm $H_2$ at 550° C. The interlayer(s) and the upper amorphous Si are changed into a poly-crystalline structure during the subsequent annealing step.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A semiconductor device comprising:
    a semiconductor substrate having a surface;
    a gate insulating layer formed over the surface of the semiconductor substrate; and
    a gate electrode formed over the gate insulating layer;
    wherein the gate electrode includes a lower poly-SiGe layer having a columnar crystalline structure, and an upper poly-Si layer having a random crystalline structure.

2. The device of claim 1, wherein a grain size of the upper poly-Si layer is larger than a grain size of the lower poly-SiGe layer.

3. The device of claim 1, wherein a grain size of the upper poly-Si layer in a direction horizontal to the surface of the semiconductor substrate is at least as great as a grain size of the upper poly-Si layer in a direction vertical to the surface of the semiconductor substrate.

4. The device of claim 1, further comprising a seed layer interposed between the lower poly-SiGe layer and the gate insulating layer.

5. The device of claim 1, further comprising at least one intermediate layer interposed between the upper poly-Si layer and the lower poly-SiGe layer.

6. The device of claim 5, wherein the at least one intermediate layer includes a Si layer.

7. The device of claim 5, wherein the at least one intermediate layer includes a SiGe layer.

8. The device of claim 5 wherein the at least one intermediate layer includes a Si layer and a SiGe layer.

9. A semiconductor device comprising:
    a semiconductor substrate having a surface;
    a gate insulating layer formed over the surface of the semiconductor substrate; and
    a gate electrode formed over the gate insulating layer;
    wherein the gate electrode includes a lower poly-SiGe layer having a columnar crystalline structure, an intermediate layer having an random crystalline structure, and an upper poly-Si layer having a columnar crystalline structure.

10. The device of claim 9, wherein the intermediate layer is a poly-Si layer.

11. The device of claim 9, wherein the intermediate layer is a poly-SiGe layer.

12. The device of claim 9, wherein a grain size of the intermediate layer is larger than a grain size of the lower poly-SiGe layer.

* * * * *